United States Patent [19]
Watanabe et al.

[11] Patent Number: 5,713,125
[45] Date of Patent: Feb. 3, 1998

[54] ELECTRONIC PARTS MOUNTING METHOD EMPLOYING MEMORY EQUIPPED PARTS SUPPLY DEVICES

[75] Inventors: Nobuhisa Watanabe, Kobe; Masatoshi Yanagawa, Katano; Noriaki Yoshida, Ikeda; Takashi Noyama, Suita; Masao Iritani, Shijonawate; Shinji Morimoto, Neyagawa, all of Japan

[73] Assignee: Matsushita Electric Industrial Co., Ltd., Kadoma, Japan

[21] Appl. No.: 368,616

[22] Filed: Jan. 4, 1995

Related U.S. Application Data

[62] Division of Ser. No. 72,872, Jun. 4, 1993, Pat. No. 5,400,497, which is a continuation of Ser. No. 783,998, Oct. 29, 1991, abandoned.

[30] Foreign Application Priority Data

Oct. 29, 1990 [JP] Japan ............................ 2-292336
Oct. 29, 1990 [JP] Japan ............................ 2-292405

[51] Int. Cl.$^6$ .................... H01R 43/00; H05K 13/00
[52] U.S. Cl. .................... 29/833; 29/840; 29/705; 29/740
[58] Field of Search .................. 29/705, 740, 743, 29/720, 721, 833, 407, 840

[56] References Cited

U.S. PATENT DOCUMENTS

| | | | |
|---|---|---|---|
| 4,889,229 | 12/1989 | Yamamoto et al. | 29/740 X |
| 4,914,808 | 4/1990 | Okumura et al. | |
| 5,018,936 | 5/1991 | Izumi et al. | |
| 5,235,164 | 8/1993 | Noyama et al. | |

FOREIGN PATENT DOCUMENTS

| | | |
|---|---|---|
| 3-120897 | 5/1991 | Japan. |
| 3-268492 | 11/1991 | Japan. |

*Primary Examiner*—Carl E. Hall
*Attorney, Agent, or Firm*—Wenderoth, Lind & Ponack

[57] ABSTRACT

Electronic parts are mounted onto a substrate. A parts supply device holds a plurality of electronic parts and moves to be positioned at a predetermined parts take-out position. The parts supply device includes a readable and writable memory for storing data indicative of the plurality of electronic parts held therein. A reading device reads the data stored in the readable and writable memory provided in the parts supply device when the parts supply device moves relative to the reading device to the predetermined parts take-out position. The electronic part is extracted from the parts supply device position at the predetermined parts take-out position and mounted on a substrate.

8 Claims, 17 Drawing Sheets

Fig. 8

| Z POSITION | PARTS NAME | CONDITION |
|---|---|---|
| 1 | ............ | OK |
| 2 | ............ | OK |
| 3 | ............ | NG |
| ⋮ | ⋮ | ⋮ |

Fig. 13

| Z POSITION | PARTS NAME | ADVANCE NOTICE OF PARTS SHORTAGE (min) 60   120   180 |
|---|---|---|
| 14 | ......... | |
| 70 | ......... | |
| 2 | ......... | |
| 30 | ......... | |
| 47 | ......... | |
| ⋮ | ⋮ | |

Fig. 10

| Z NUMBER | PARTS NAME | SPARE NUMBER OF PARTS SHORTAGE |
|---|---|---|
| 1 | 1608 ABC | 0 |
| 2 | QFP-10Z | 0 |
| 3 | 1005C | 200 |
| ⋮ | ⋮ | ⋮ |
| 200 | 1005C | 0 |

Fig. 11

| RARTS NAME | RARTS KIND/ VOLUME [mm³] | MOUNTING SPEED [sec/tact] | SUCTION NOZZLE | CAMERA CHANGE | COATING LEVEL [sec] | IS LINE SENSOR USED? |
|---|---|---|---|---|---|---|
| 1608 ABC | CHIP / 0.5 | 0.25 | 20B | SMALL | 0.02 | YES |
| 1005C | MICRO-CHIP / 0.1 | 0.18 | 20A | SMALL | 0.01 | YES |
| QFP-10Z | QFP / 800 | 0.6 | 20E | LARGE | 0.06 | NO |

ELECTRONIC PARTS MOUNTING METHOD EMPLOYING MEMORY EQUIPPED PARTS SUPPLY DEVICES

This is a Divisional of application Ser. No. 08/072,872, filed Jun. 4, 1993, now U.S. Pat. No. 5,400,497 which is a Continuation of now abandoned application Ser. No. 07/783,998, filed Oct. 29, 1991 abandoned.

BACKGROUND OF THE INVENTION

The present invention relates to an electronic parts mounting apparatus and method for mounting various kinds of parts such as electronic parts on a circuit substrate.

According to a conventional apparatus for mounting an electronic part on a substrate, a parts unit comprising a tape-shaped electronic parts member having a reel around which a tape-shaped member holding many electronic parts is mounted on a parts cassette serving as a parts supply device. The parts cassettes are mounted on the parts supply section of the electronic parts mounting apparatus in a predetermined order.

In mounting the part on the substrate, the parts cassette holding electronic parts of a predetermined kind is placed at a position at which the part is sequentially taken out from the parts cassette. Each parts cassette sequentially feeds out the tape-shaped electronic parts units according to an operation for mounting an electronic part on the substrate. As a result, the electronic part is sequentially fed to a parts take-out position. Then, respective electronic parts are mounted on the substrate.

In checking whether or not a parts cassette has been set on a predetermined position of the parts supply section before mounting an electronic part on the substrate so as to avoid an erroneous mounting of an electronic part, as shown in FIG. 17, parts cassettes 71 set on a parts supply section are sequentially removed therefrom and an operator reads a bar code 73 provided on a reel 72 of a tape-shaped electronic parts unit mounted on the parts cassette 71 by means of a bar code reader 74. Then, the kind of parts read by the bar code reader 74 is compared automatically with that of parts registered in the control section of the electronic parts mounting apparatus.

When an electronic part is mounted on a different kind of substrate, an operator produces information such as the parts mounting speed required in mounting an electronic part on the substrate by checking the arrangement of the parts supply device and parts mounting condition by utilizing an operation panel or a monitor screen.

In an electronic parts mounting apparatus having a function of inspecting the characteristics of the part such as the resistance value or the capacitance thereof by measuring them before mounting the part on the electronic parts mounting apparatus, the reference value of the characteristics of the part with which values obtained by the measurement are compared are manually inputted to the control section of the electronic parts mounting apparatus.

However, it takes a long time to check whether or not a parts cassette is at the correct position of the parts supply section of the electronic parts mounting apparatus because the checking operation cannot be performed without manual labor. In addition, the part may be erroneously mounted on the substrate due to a mis-checking.

Another disadvantage of the conventional electronic parts mounting apparatus is that an operator is required to manually input the data of the parts mounting conditions to the control section of the electronic parts mounting apparatus by the help of an operation panel and the monitor screen of the parts mounting apparatus. With the recent development of the technology of mounting an electronic part on the substrate, parts mounting condition such as the generation of the parts distinguishing data is becoming more and more complicated. Therefore, the operator must expend additional efforts.

As described above, the operator is required to manually input the data of the characteristics of the part to the control section of the electronic parts mounting apparatus in inspecting the characteristic of the part, which takes much time and labor.

SUMMARY OF THE INVENTION

A first object of the present invention is to provide an electronic parts mounting apparatus which allows for automatic inspection as to whether or not a parts supply device has been set in position on the parts supply section thereof in a shorter period of time and eliminates an erroneous mounting of an electronic part on a substrate.

A second object of the present invention is to provide an electronic parts mounting method which allows an automatic input of the data of the characteristic of an electronic part in a shorter period of time in inspecting the characteristic of the part and prevents the mounting of a defective electronic part and an erroneous mounting of an electronic part on the substrate.

A third object of the present invention is to provide an electronic parts mounting method which reduces time and labor in producing data, increase the operation rate of the electronic parts mounting apparatus by reducing the period of time required for producing the data, and eliminates a mis-mounting of an electronic part.

In accomplishing the first object, according to a first aspect of the present invention, there is provided an electronic parts mounting apparatus comprising:

a parts supply device for holding a plurality of electronic parts, and for moving and being positioned at a predetermined parts take-out position, the parts supply device including first storing means for storing data indicative of the parts held therein;

a substrate positioning means for positioning a substrate, on which at least one of the plural electronic parts is to be mounted, at a predetermined substrate position;

a substrate supply means for supplying the substrate to the substrate positioning means;

a substrate discharge means for discharging the substrate from the substrate positioning means;

a reading means for reading the data stored in the first storing means provided in the parts supply device when the parts supply device moves relative to the reading means; and a mounting means for mounting the part supplied by the parts supply device on the substrate set at the predetermined substrate position by the substrate positioning means.

According to the above construction, when the parts supply devices move relative to the reading means, the reading means is capable of automatically reading the kind of the part held by each parts supply device. Thus, according to the apparatus, the mounted condition of each parts supply device can be automatically inspected by comparing the registered reference position of corresponding electronic part.

In accomplishing the second object, according to a second aspect of the present invention, there is provided a parts mounting method comprising:

- a first step, to be performed by a reading means provided in an electronic parts mounting apparatus, of reading a name of an electronic part and a reference value of characteristic of the part stored in a storing means provided in a parts supply device;
- a second step, to be performed by a measuring means, of measuring the characteristic of the part taken out from the parts supply device;
- a third step of conducting a characteristic test of the part by comparing with each other the reference value of the characteristic of the part read in the first step and the characteristic value of the part measured in the second step; and
- a fourth step of mounting the part which has passed the characteristic test conducted in the third step.

According to the above method, the reading means reads the reference value of the characteristic of the part above the parts supply section and the storing means of the parts supply device stores the reference value of the characteristic of the parts. Therefore, the reference value of the characteristic of the part to be used in inspecting the characteristic of the part can be automatically inputted.

In accomplishing the third object, according to a third aspect of the present invention, parts mounting data necessary for mounting an electronic part on the electronic parts mounting apparatus is automatically produced when a parts supply device holding a plurality of electronic parts has been set on the parts supply section. That is, there is provided an electronic parts mounting method comprising:

- a first step of reading distinguishing marks provided on parts units each having a plurality of electronic parts and taking out data of mounting condition of the parts units from a data base stored in a storage based on data of the kind of parts;
- a second step of writing the data obtained in the first step into storing means of parts supply devices having the part units mounted thereon;
- a third step of mounting the plural parts supply devices on an electronic parts mounting apparatus;
- a fourth step of reading out parts distinguishing data and data necessary in mounting the part on a substrate stored in the storing means of each of the parts supply devices provided in a parts supply section of the electronic parts mounting apparatus;
- a fifth step of producing, based on the data, data indicating a relationship between the part and a mounting position where each of the parts supply devices is mounted on the electronic parts mounting apparatus; and
- a sixth step of mounting the part on the substrate based on the data read out in the fourth step and the data produced in the fifth step.

According to the above method, the storing means of each parts supply device stores the data of the kind of the part mounted thereon and the data of the condition for mounting the part on a substrate according to the data of the kind of the part. After each parts supply device is mounted on the parts mounting apparatus, the reading means of the parts supply device reads the above data and data connecting the mounting position of the parts supply device and the mounting condition with each other. Thus, the parts mounting operation can be efficiently performed without checking the arrangement of the parts supply devices and the mounting condition utilizing an operation panel or a monitor screen.

BRIEF DESCRIPTION OF THE DRAWINGS

These and other objects and features of the present invention will become clear from the following description taken in conjunction with the preferred embodiments thereof with reference to the accompanying drawings, in which:

FIG. 8 is a view display screen showing the results of a determination as to whether or not the parts supply device has been set in position on the electronic parts mounting apparatus;

FIG. 10 is a view showing a parts supply arrangement program which is data necessary for parts mounting;

FIG. 11 is a view showing parts data necessary for parts mounting;

FIG. 13 is a view showing a parts shortage advance notification;

DETAILED DESCRIPTION OF THE INVENTION

Figure 1:
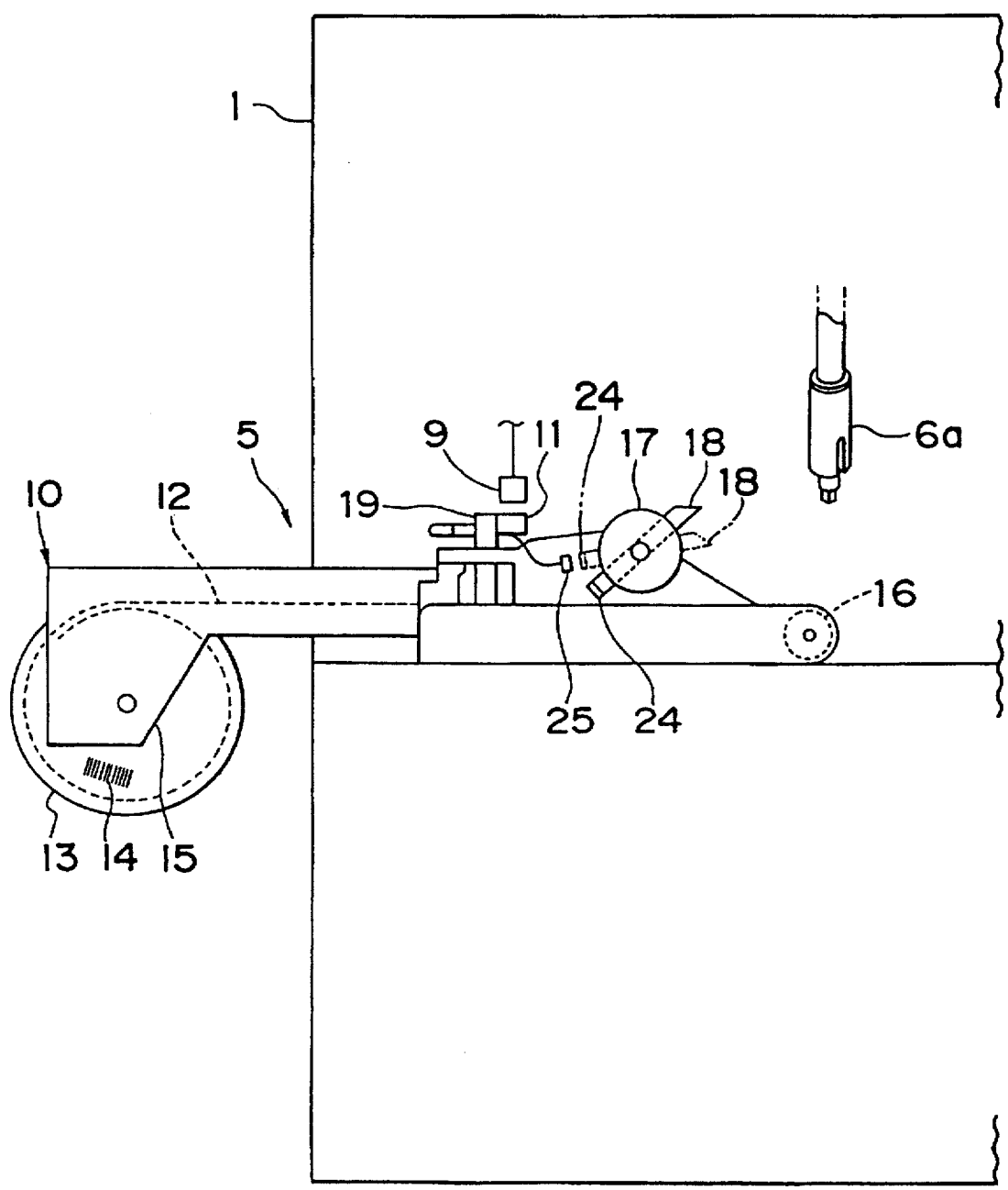
FIG. 1 is a front view showing a parts supply device provided in the parts supply section of an electronic parts mounting apparatus according to one embodiment of the present invention.

Before the description of the present invention proceeds, it is to be noted that like parts are designated by like reference numerals throughout the accompanying drawings.

Figure 2:
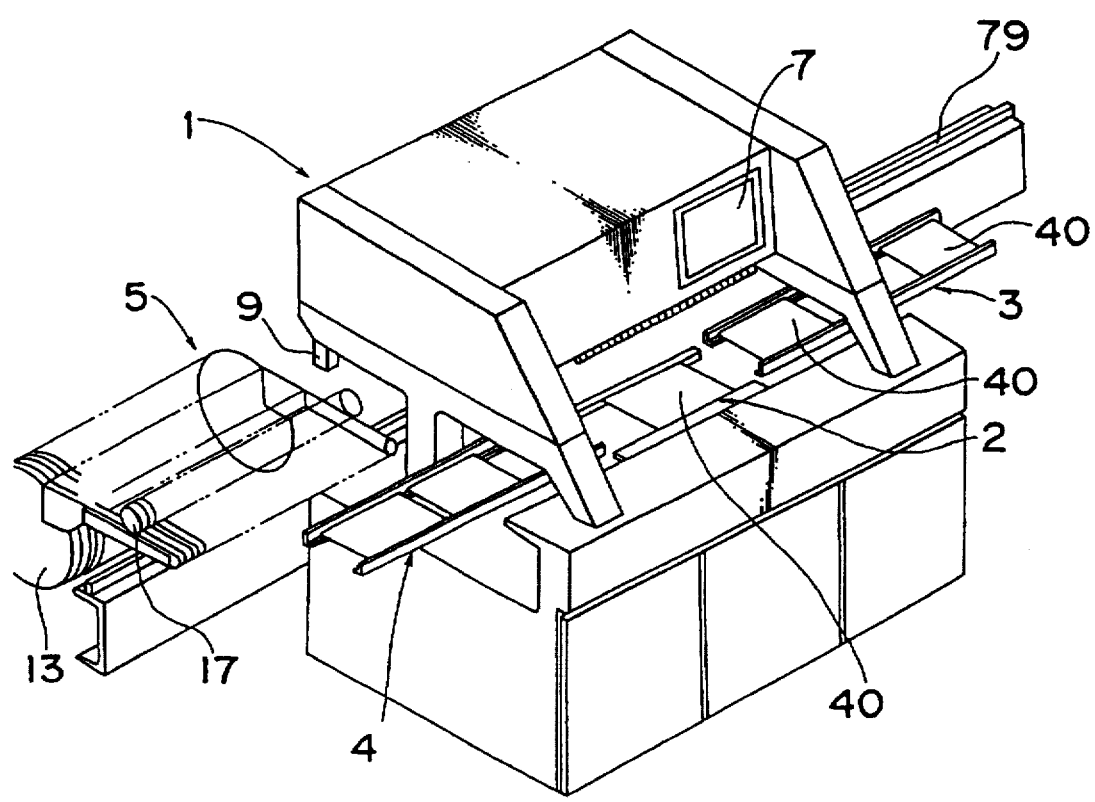
FIG. 2 is a perspective view showing the electronic parts mounting apparatus.
Figure 3:
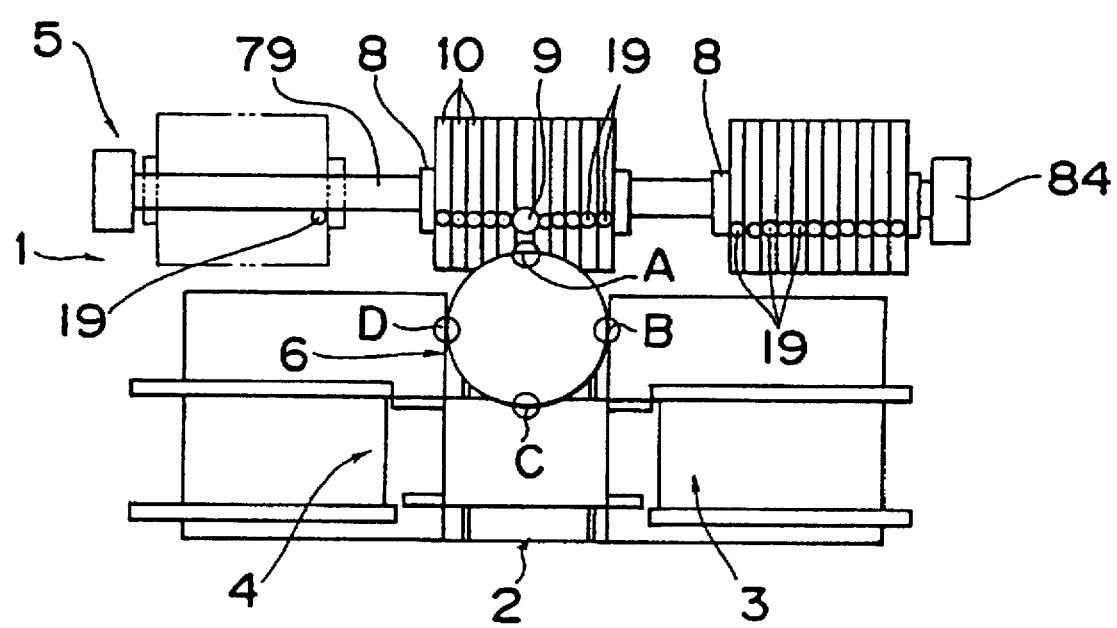
FIG. 3 is a plan view showing the electronic parts mounting apparatus.

An embodiment of the present invention is described below with reference to FIGS. 1 through 3.

Figure 18:
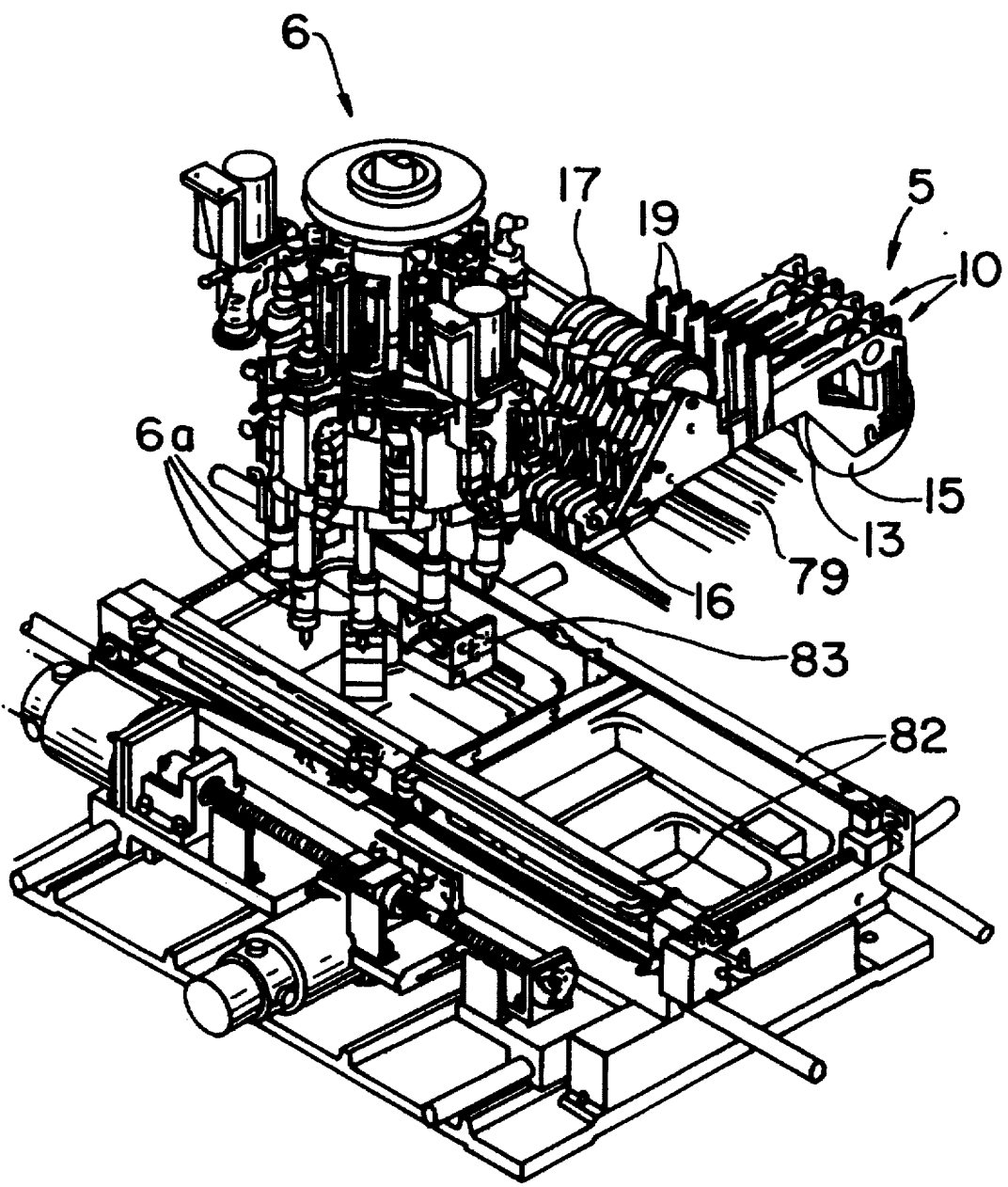
FIG. 18 is a perspective view partially showing the parts mounting apparatus.

FIG. 1 is a front view showing a parts supply device provided in the parts supply section of a parts mounting apparatus according to the embodiment. FIG. 2 is a perspective view showing the parts mounting apparatus. FIG. 3 is a plan view showing the parts mounting apparatus. FIG. 18 is a perspective view partially showing the parts mounting apparatus. FIG. 19 is an enlarged perspective view partially showing the parts mounting apparatus. FIGS. 20A–20E are views showing a suction nozzle of the parts mounting apparatus.

Figure 19A:
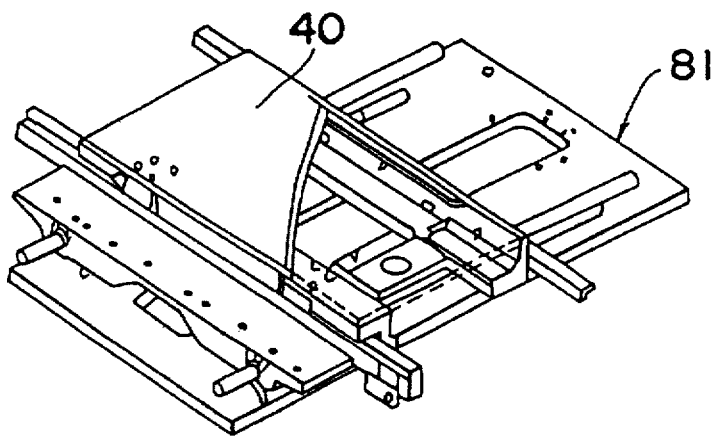
FIG. 19A–19C are enlarged perspective views, partially showing the parts mounting apparatus.
Figure 19B:
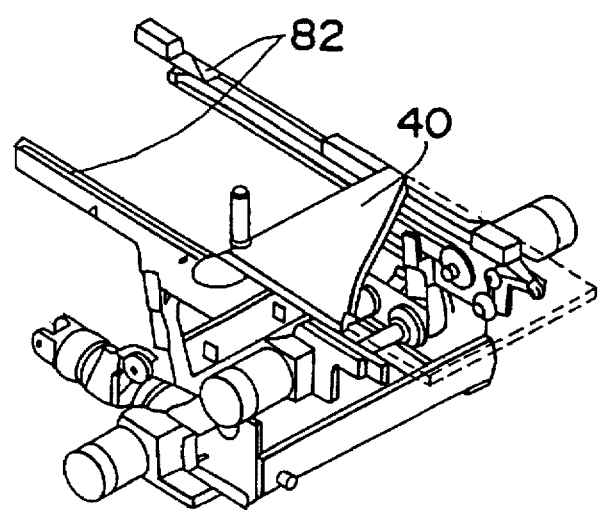
Figure 19C:
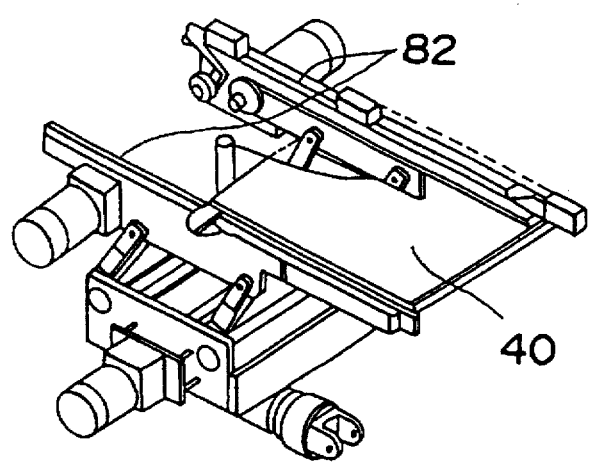
Figure 20A:
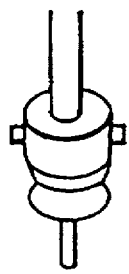
FIGS. 20A–20E are views showing an electronic suction nozzle of the parts mounting apparatus.
Figure 20B:
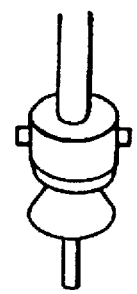
Figure 20C:
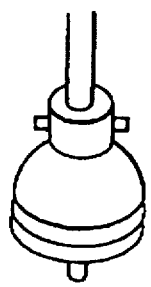
Figure 20D:
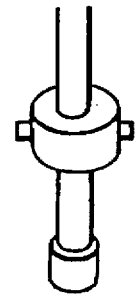
Figure 20E:
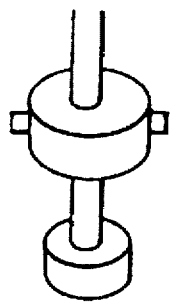

The parts mounting apparatus 1 comprises a substrate positioning section 2, provided in the front thereof, for positioning a substrate 40 at a predetermined parts mounting position (C) upon mounting an electronic part or parts thereon; a substrate supply device 3 for supplying the substrate 40 to the substrate positioning section 2; and a substrate discharge device 4 for discharging the substrate 40 therefrom. The substrate supply device 3 and the substrate discharge device 4 are also positioned in the front of the parts mounting apparatus 1. The parts mounting apparatus 1 further comprises a parts supply section 5 positioned in the back thereof. FIG. 19 shows the construction of the substrate positioning section 2, the substrate supply device 3, and the substrate discharge device 4. FIG. 19A shows the substrate positioning section 2 where an X-Y table 81 for supporting the substrate 40 is driven in an x-direction and a y-direction on a horizontal surface. FIG. 19B shows the substrate supply device 3 in which the substrate 40 is put on a pair of roller belts 82 and moved to supply to the substrate positioning section 2 by driving of the belts 82. FIG. 19C shows the substrate discharge device 4 in which similar to the substrate supply device 3, the substrate 40 is put on the belts 82 and moved to discharged from the substrate positioning section 2. As shown in FIG. 3, a parts mounting device 6 of a rotary system is provided between the substrate positioning section 2 and the parts supply section 5. The parts mounting device 6 includes suction nozzles 6a for suctioning the part and moving between a parts take-out position (A) from which an electronic part is taken out in the parts supply section 5; a characteristic measuring position (B) at which the characteristics of the part is measured by a characteristic measuring device 83; and a parts mounting position (C) at which the part is mounted on the substrate in the substrate positioning section 2. A display device 7 consisting of a monitor television is positioned on the upper front of the parts mounting apparatus 1. FIGS. 20A–20E show various kinds of suction nozzles 6a described above.

A pair of parts supply bases 8 movable in the longitudinal direction of the parts mounting apparatus 1 is provided on a guide rail 79 in the parts supply section 5. A plurality of parts cassettes 10 serving as devices for supplying an electronic part to the parts mounting device 6 are arranged in the moving direction of the parts supply base 8 on the parts supply base 8. The parts supply bases 8 are moved by driving of a motor 84, so that a desired parts cassette 10 placed on the parts supply base 8 can be positioned in correspondence with the parts take-out position (A). A reading/writing means 9 is provided above the parts supply section 5 in correspondence with the parts take-out position (A) as well as each parts supply base 8. The reading/writing means 9 performs reading and writing in communication with a recording section 11 composed of an IC memory provided on the parts cassette 10. The recording section 11 will be described later.

As shown in FIG. 1, a tape-shaped electronic parts unit 12 is mounted on the parts cassette 10 and a bar code 14 is attached to the side cover of a reel 13 of the tape-shaped electronic parts unit 12. The tape-shaped electronic parts unit 12 is composed of electronic parts removably attached onto a carrier tape and covered with a cover tape. The tapes and the parts are wounded around the reel 13. The bar code 14 displays a serial number for distinguishing parts from each other, a parts name, the initial quantity of parts held by the parts cassette 10, the data of condition for mounting the part on the substrate 40, the and characteristic of the part such as the resistance value or capacitance of the part. The data of condition is specifically shown in FIG. 11. In FIG. 11, the data for each parts name is composed of the parts kind/volume, the mounting speed, the kinds of suction nozzles for holding the part or the parts, the camera change, the coating level, i.e. coating amount, of adhesive, the presence of the line sensor, etc. For example, in the parts name of 160ABC, the kinds of parts is "chip". The mounting operation for mounting this part on a substrate is performed under a volume of 0.5 mm$^3$; a mounting speed of 0.25 sec/tact; and a coating level of 0.02 sec-coating time; and the usage of the suction nozzle of No. 20A shown in FIG. 20A and selected from suction nozzles shown in FIGS. 20A–20E, the small camera, and the line sensor.

The parts cassette 10 has a reel mounting section 15 for rotatably mounting the reel 13 of the parts unit 12 in the rear thereof; a feeding section 16, provided in the front end thereof, for sequentially moving each part to the parts take-out position (A) by feeding the parts unit 12 intermittently; a winding section 17, positioned in the rear of the feeding section 16, for winding the cover tape of the parts unit 12; and a pivotal lever 18, positioned in the rear of the feeding section 16, for driving the feeding section 16. A locking section 19 for setting the parts cassette 10 on the parts mounting apparatus 1 is provided in the rear of the winding section 17. The recording section 11 is provided in the locking section 19.

Figure 4:
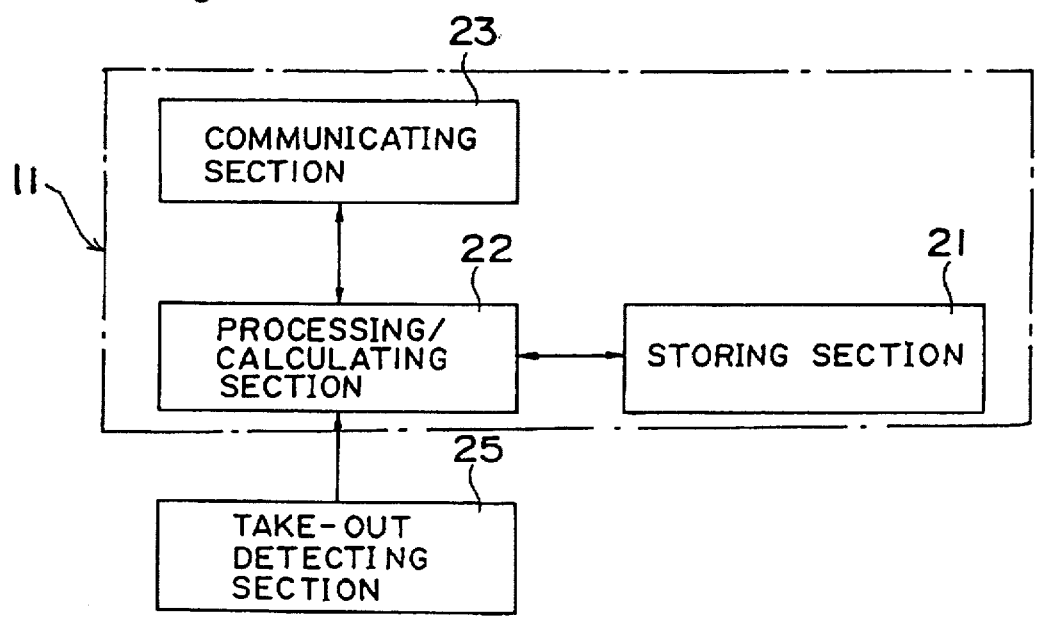
FIG. 4 is a block diagram showing the construction of a recording section of the parts supply device.

FIG. 4 is a block diagram showing the construction of the recording section 11.

As shown in FIG. 4, the recording section 11 comprises a storing section 21 for readably and writably storing the parts name and the quantity of parts held by the parts unit 12 in the parts cassette 10, the condition for mounting the part on the substrate, and the characteristic of the part; a processing/calculating section 22 for subtracting "1" from the quantity of parts stored in the storing section 21 according to a signal inputted thereto each time the part or the desired number of parts is taken out from the parts unit 12 and writing the value obtained by the subtraction into the storing section 21; and a communicating section 23 for communicating a content stored in the storing section 21 with the reading/writing means 9 in the parts supply section 5 of the parts mounting apparatus i via the processing/calculating section 22. A take-out detecting section 25 for outputting a signal upon detection of magnetic force is provided at a position in the vicinity of termination of the moving locus of a permanent magnet 24 mounted on an end of the pivotal lever 18. The take-out detecting section 25 outputs a signal each time the part or the desired number of parts is taken out from the parts unit 12.

Figure 5:
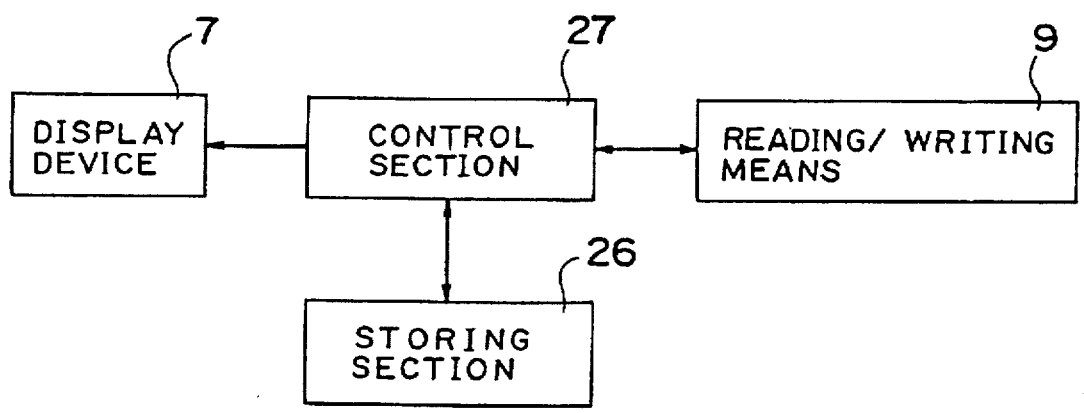
FIG. 5 is a block diagram showing the control device of the electronic parts mounting apparatus.

FIG. 5 is a block diagram showing the control device of the electronic parts mounting apparatus 1. The control device of the parts mounting apparatus 1 comprises a storing section 26 for storing data of the parts mounting operation program of each kind of substrate to be manufactured, the parts name to be used therefor, the characteristic value of parts, the data of mounting parts on the substrate, the parts mounting condition, the quantity of parts to be used, the mounting position of each parts cassette 10 on the parts supply base 8, and the period of time required for mounting the part or the desired number of parts on one substrate; a control section 27 for controlling the operation of the parts mounting apparatus 1, deciding whether or not the parts cassette 10 has been placed in position on the parts supply base 8, deciding the order of a parts shortage, and communicating data with the recording section 11 of the parts cassette 10 via the reading/writing means 9; and the display device 7 for displaying a result obtained by the decision of the control section 29.

Separately from the electronic parts mounting apparatus 1, a parts managing section for making a centralized management of the parts unit 12 is provided.

Figure 6:
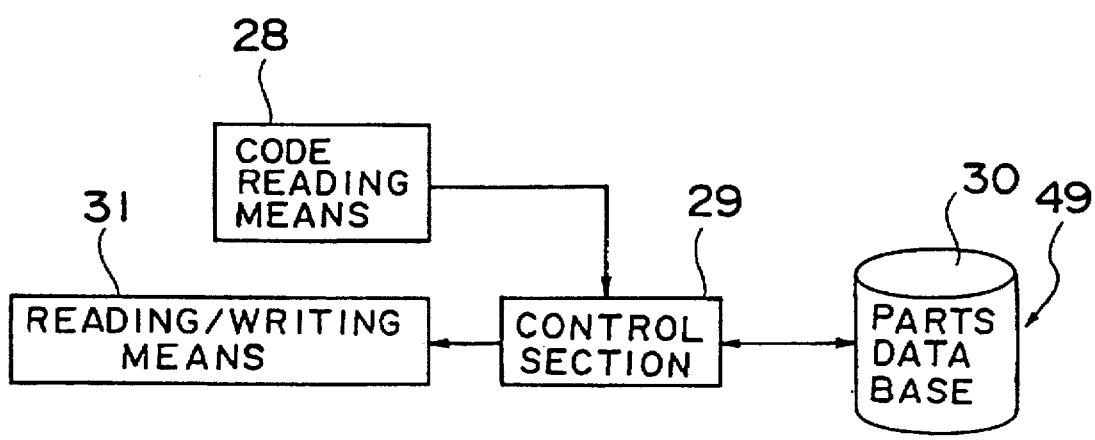
FIG. 6 is a block diagram showing a parts managing section.

FIG. 6 is a block diagram of the parts managing section. The parts managing section comprises a code reading means 28 for reading the bar code 14 attached to the parts unit 12; a shortage 49 with a parts data base 30 for storing, for each serial number of the parts unit 12, a parts name, the reference value of characteristic of each part, the data of the condition for mounting the part on the substrate, and the data of the quantity of parts held by the parts unit 12; a reading/writing means 31 for communicating the above data with the recording section 11 of the parts cassette 10; and a control section 29 for controlling these operations.

Including the feeding of the part to the parts managing section and the feed-out of the part therefrom, the parts mounting process to be performed by the parts mounting apparatus 1 is described below with reference to the flowchart of FIG. 7.

At step #1, the parts unit 12 is mounted on the parts cassette 10 based on the kind of a predetermined substrate to be produced. At step #2, the code reading means 28 reads the bar code 14 and the control section 29 takes out, from the parts data base 30, the parts name of the part held by the parts cassette 10, the reference value of the characteristic of the part, the data of the conditions for mounting the part on the substrate, and the data of the quantity of parts held by the parts cassette 10. At step #3, the reading/writing means 31 writes the data thus taken out from the parts data base 30 on the storing section 21 of the recording section 11 of the parts cassette 10. The parts name and the reference value of the characteristic of the part read from the bar code 14 may be written on the storing section 21.

At step #4, the parts cassette 10 is transported to the parts mounting apparatus 1. At step #5, each parts cassette 10 is set on a predetermined position of the parts supply base 8 of the parts supply section 5 in a predetermined order. Instead, the parts managing section may previously perform the operation for arranging the parts cassettes 10 in an appropriate order, so that they are transported to the parts supply base 8 and set thereon.

After all parts cassettes 10 are set on the parts mounting apparatus 1, an instruction for checking whether or not the parts cassettes 10 has been in position is inputted to the control section 27 of the parts mounting apparatus 1. At step #6, based on the program inputted to the storing section 26, the control section 27 of the parts mounting apparatus 1 issues an instruction for moving the parts supply bases 8 sequentially and then, the storing section 21 of each parts cassette 10 transmits the data of the name of each part to the reading/writing means 9. At step #7, the control section 27 compares the parts name of the parts cassette 10 read at step #6 with the name of the part set on respective mounting position of the parts supply position (C) stored in the storing section 26 of the parts mounting apparatus 1, thus deciding whether or not respective parts are at the predetermined positions of the parts mounting position (C), and thus, in response to the instruction issued from the control section 27, the display device 7 displays the result obtained by the decision of the control section 27 as shown in FIG. 8. If any part is not set in position, the part is set again at the mounting position at step #8. Then, the program returns to step #7. In this case, the parts cassette 10 placed on the parts supply base 8 may be replaced individually, but all the parts cassettes 10 may be replaced. While the parts cassettes 10 is being replaced on one of the parts supply bases 8, it is possible to proceed the parts mounting operation to the subsequent step by using the other parts supply base 8. If it is decided at step #7 that respective parts have been set in position on the predetermined positions of the parts supply base 8, the program goes to step #9 at which the parts mounting operation is resumed.

Figure 9:
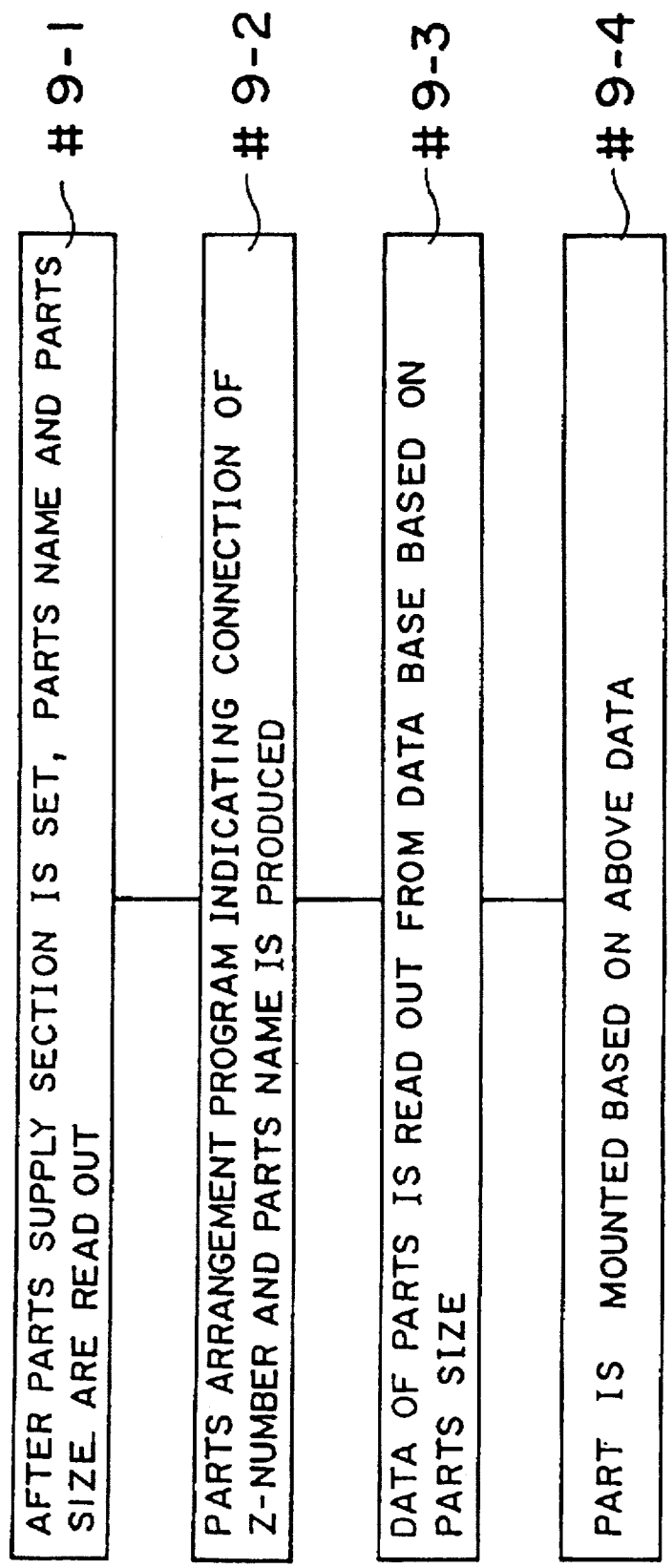
FIG. 9 is a flowchart showing the automatic generation of data necessary for parts mounting.

The process of automatically producing data necessary for mounting the part on the substrate is described below with reference to the flowchart of FIG. 9.

At step #9-1, after the parts cassette 10 is set on the parts mounting apparatus 1, the reading/writing means 9 reads the names and sizes of parts held by all parts cassettes 10. At step #9-2, the control section 27 produces a parts supply arrangement table showing which of parts cassettes 10 supplies the part to be mounted on the substrate based on the parts name read out at step #9-1 and the position information (Z-number) of the corresponding parts cassette 10 and then, the storing section 26 stores the data of the parts supply arrangement table as shown in FIG. 10. That is, parts names and spare number of parts shortage are provided in correspondence with the Z-number showing the position of the parts cassette 10 set on the parts supply section. The spare number of parts shortage indicates the number of the parts cassette 10, set on the parts supply base 8, which is capable of supplying replacing parts when a parts shortage occurs.

At step #9-3, the control section 29 calculates or pre-calculates the volume of parts based on the name and size of the parts read out at step #9-1 and then, the reading/writing means 31 reads out from the data base 30 the data of parts mounting condition (parts mounting speed, suction condition, coating condition, and nozzle to be used etc.) corresponding to a result obtained by the calculation, and thereafter, the storing section 26 stores the above data.

As shown in FIG. 11, the parts supply arrangement table shows the data of the parts mounting condition such as the volume of parts, parts mounting speed, kind of nozzle to be used for suction for holding the part or the parts, whether or not the camera is changed, and the level of suction pressure in holding the part.

At step #9-4, the control section 27 reads out the parts supply arrangement table and the data of parts from the storing section 26, thus issuing an instruction for performing the parts mounting operation.

Figure 12:
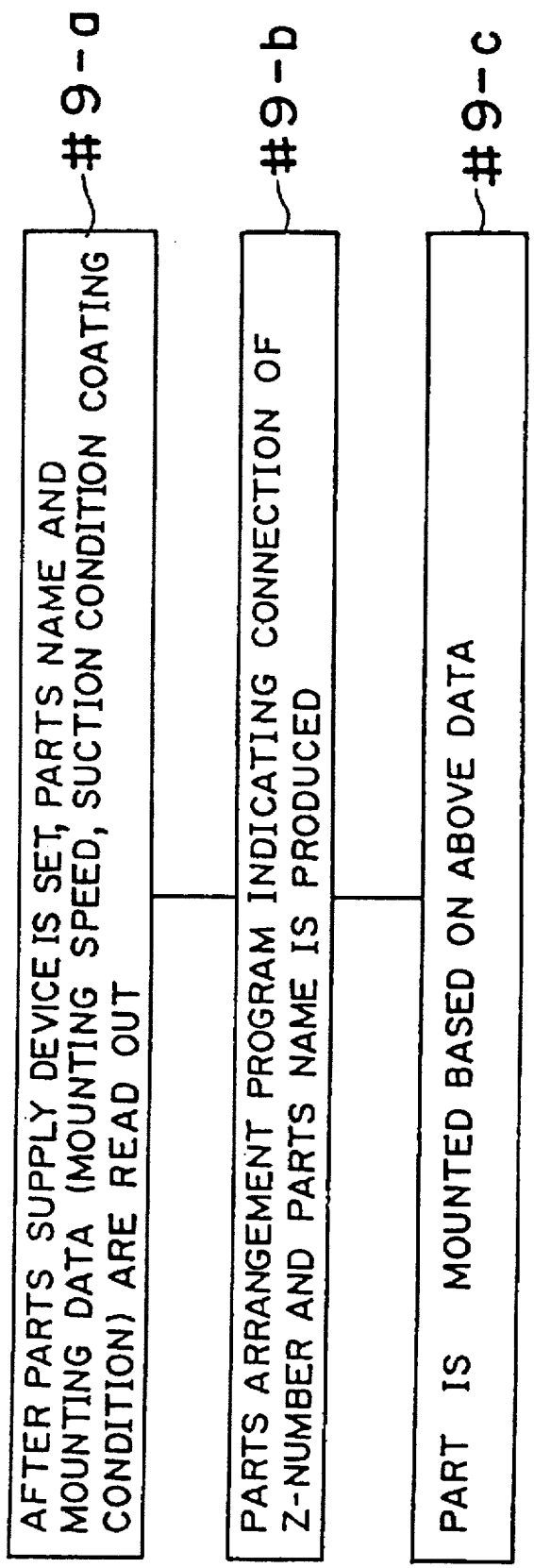
FIG. 12 is another embodiment of a flowchart showing of an automatic generation of data necessary for parts mounting.

FIG. 12 is a flowchart showing an example of the process of automatically producing the data necessary for mounting an electronic part on a substrate without the data base. At step #9-a, the reading/writing means 9 reads the name of the electronic parts held by the respective parts cassettes 10 and the data (mounting speed, suction condition, coating condition, etc.) of mounting the electronic part on the substrate after all parts cassettes 10 are set on the parts supply base 8. At step #9-b, the control section 27 forms the parts supply arrangement table indicating which of the parts cassettes 10 supplies the part to be mounted on the substrate based on the parts name read out at step #9-a and the position information (Z-number) of the parts cassette 10, and the storing section 26 stores the parts supply arrangement table thus formed.

At step #9-c, the control section 27 reads out the content of the parts supply arrangement table and parts data from the storing section 26, and issues an instruction for performing a parts mounting operation.

In this parts mounting operation, the parts mounting device 6 takes out a part or parts from the parts take-out position (A) by the suction nozzle 6a, measures the characteristic value of the part at the characteristic measuring position (B) by the measuring device 83, and compares the measured characteristic value with the reference value of the characteristic of the part read out from the storing section 21 of the parts cassette 10 and stored in the storing section 26 of the parts mounting apparatus 1. If the measured characteristic value is not proper, the part is not mounted on the parts mounting apparatus 1, but the part is fed out from the parts mounting apparatus 1 at the discharge position (D). Then, another electronic part replacing the discharged part is taken out from the same parts cassette 10 by the suction nozzle 6a and the part having a proper characteristic value is mounted on a predetermined position of the substrate at the parts mounting position (C).

During the parts mounting operation, the pivotal lever 18 pivots each time a part is taken out from the parts cassette 10 and a removal detecting signal is outputted from the take-out detecting section 25. Each time the signal is outputted, "1" is subtracted from the quantity of parts stored in the storing section 21 and the value obtained by the subtraction is rewritten into the storing section 21. Whether or not a parts shortage has occurred is checked during the parts mounting operation, when an instruction for performing a parts shortage checking is inputted to the control section 27 of the parts mounting apparatus 1.

Figure 7:
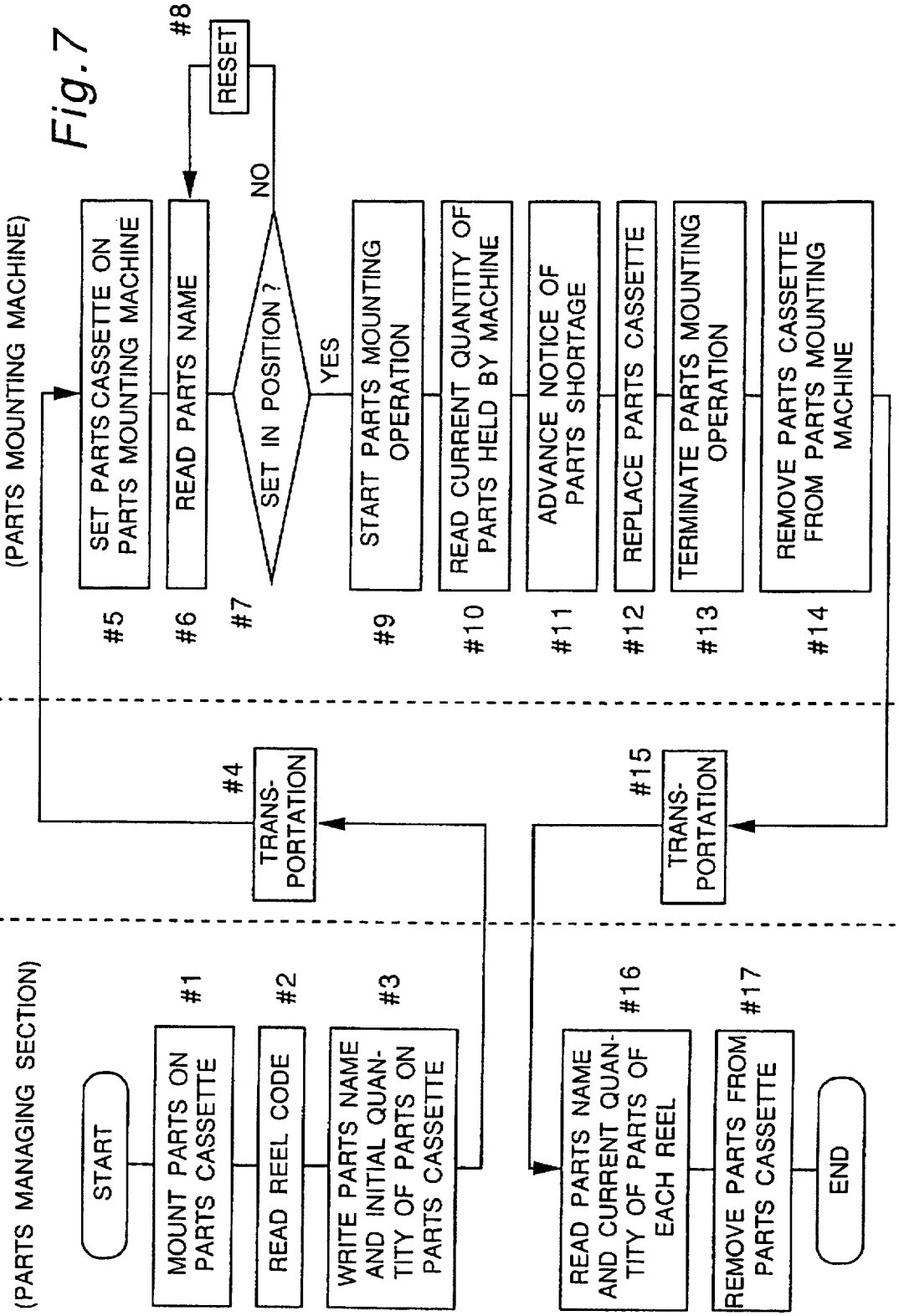
FIG. 7 is a flowchart showing an electronic parts mounting method according to one embodiment of the present invention.

Referring to the flowchart of FIG. 7, the control section 27 reads the current value of the quantity of parts held by the parts cassette 10 stored in the storing section 21 of the respective parts cassette 10 at step #10 and calculates the period of time required for a parts shortage to occur based on the quantity of parts to be used per substrate and the period of time required for mounting the part on one substrate. Then, at step #11, the display device 7 displays the result obtained by the calculation performed by the control section 27 as shown in FIG. 13. At step #12, parts cassette 10 in which any parts have been exhausted is replaced without suspending the parts mounting operation by replacing the parts supply bases 8. In addition, the control section 27 decides the order of parts shortage among the parts cassettes 10. Therefore, no parts shortages occur by replacing one parts cassette with another. Thus, the parts mounting apparatus 1 has a high operation rate.

At step #13, the parts mounting operation terminates. At step #14, the parts cassettes 10 are taken out from the parts supply section 5 of the parts mounting apparatus 1. At step #15, the parts cassettes 10 are transported to the parts managing section.

At step #16, in the parts managing section, the code reading means 28 reads the bar code 14 of the parts unit 12 and the reading/writing means 31 reads the parts name, the characteristic value thereof, and the quantity of remaining parts and then, the data thus read is stored in the parts data base 30 together with the serial number of the parts unit 12. At step #17, the parts unit 12 is removed from the parts cassette 10.

Figure 14:
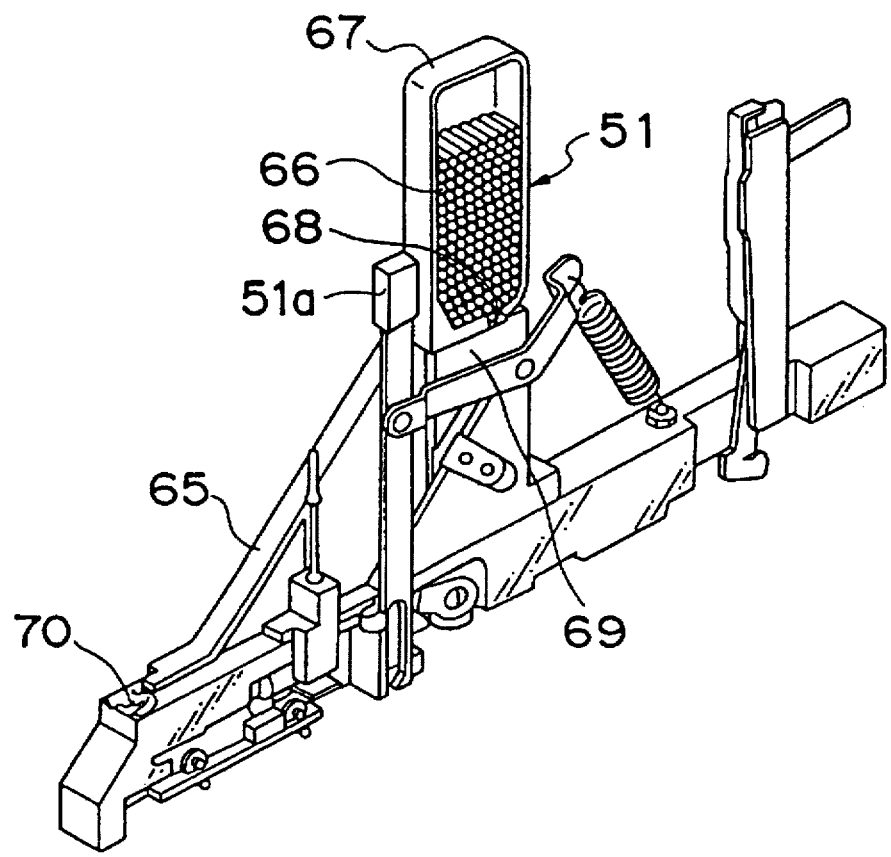
FIG. 14 is a perspective view showing a parts supply device of a bulk cassette type.
Figure 16:
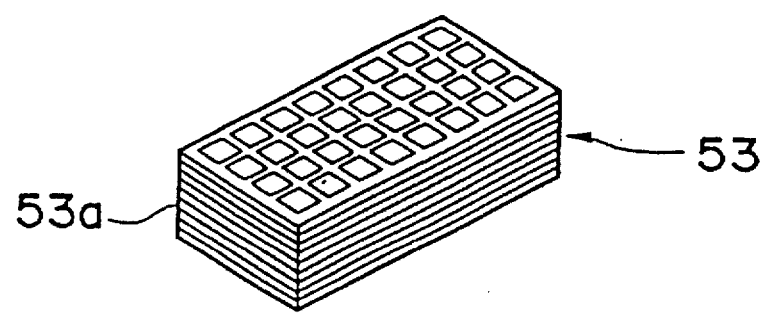
FIG. 16 is a perspective view showing a parts supply device of a tray type.
Figure 15:
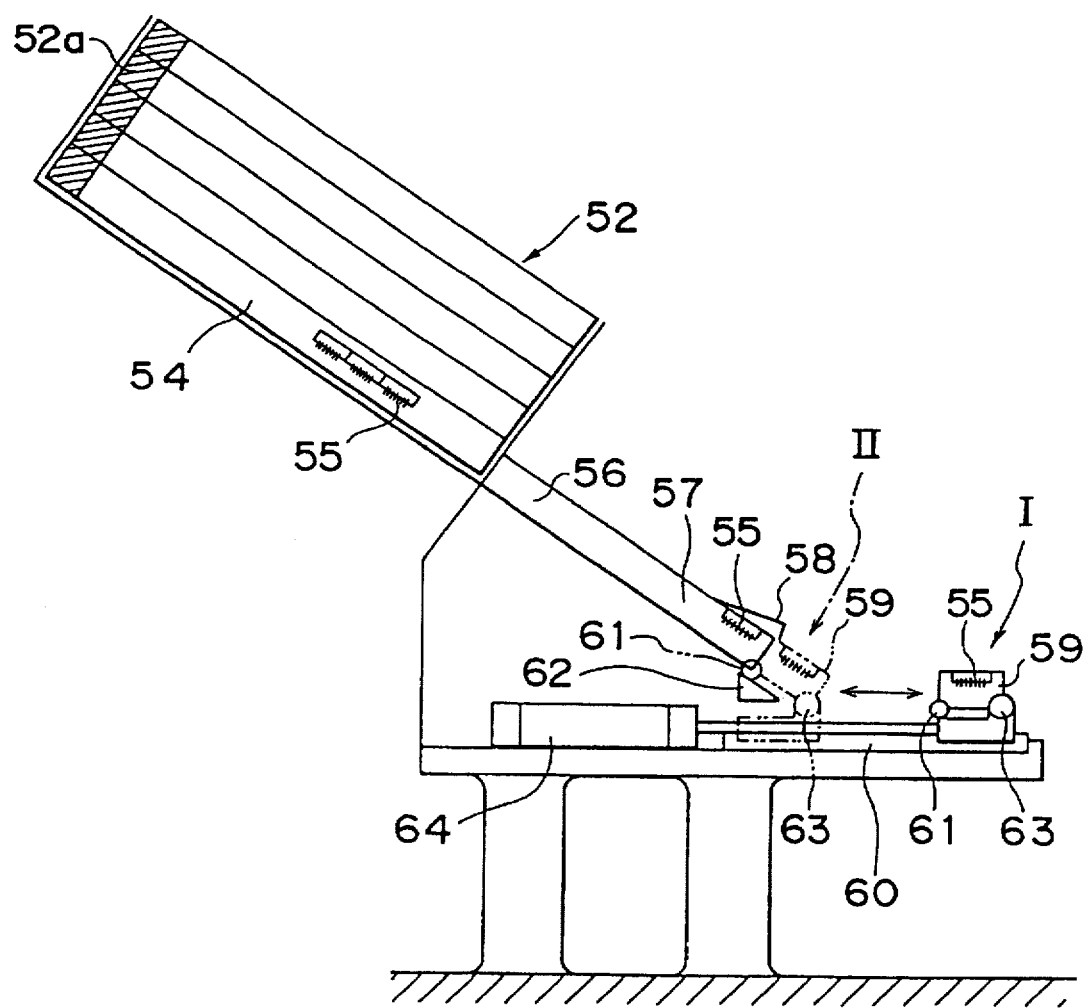
FIG. 15 is a perspective view showing a parts supply device of a stick type.
Figure 17:
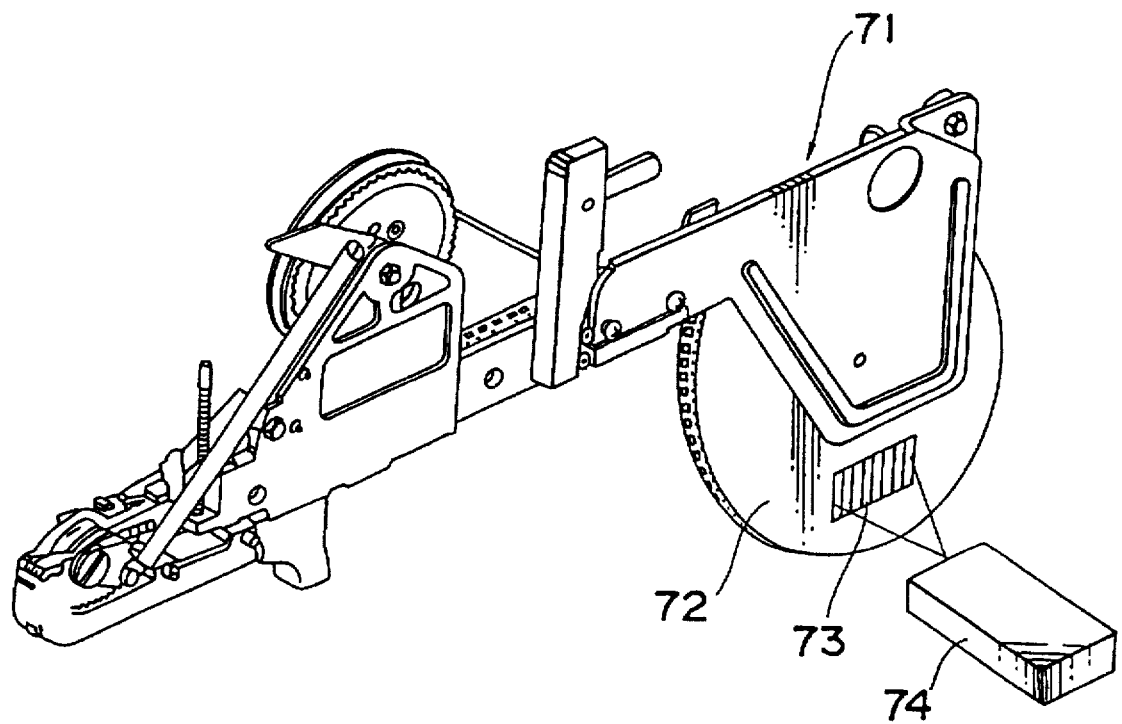
FIG. 17 is a perspective view showing a conventional method of inspecting whether or not a parts supply device has been set in position on an electronic parts mounting apparatus.

The present invention may be applied to a parts supply device other than the parts cassette 10. For example, a bulk cassette type parts supply device 51 in which a container accommodates many parts as shown in FIG. 14, a stick type parts supply device 52 in which parts are slidably held by a stick-shaped guide member as shown in FIG. 15, and a tray type parts supply device 53 having a tray accommodating arranged parts as shown in FIG. 16. These parts supply devices 51, 52, and 53 include a storing section storing the quantity of parts held thereby and recording sections 51a, 52a, and 53a including a processing/calculating section for rewriting the quantity of parts held thereby according to a parts take-out operation, respectively.

FIG. 14 shows a front view of the bulk-cassette type parts supply device 51. A bulk cassette 67 accommodating electronic parts 66 is connected with an incline shoot 65. A parts takeoff 70 is formed at one end of the incline shoot 65. An air blowing device (not shown) for feeding air and a vacant portion (not shown) connecting the inside of the bulk cassette 67 with an air intake 68 formed at the lower end of the bulk cassette 67 are formed inside of a support stand 69 for supporting the bulk cassette 67. Only one of the electronic parts can pass through a space defined at the connecting portion between the bulk cassette 67 and the incline shoot 65. Air supplied from the air blowing device is fed in the bulk cassette through the space and the air intake 68. The air is projected to the electronic parts so that one of the electronic parts is inserted into the space between the bulk cassette 67 and the incline shoot 65. Since only one of the electronic parts can pass through the space, only one of the parts is fed to the incline shoot 65 to reach the parts take off 70.

FIG. 15 shows a front view of the stick type parts supply device 52. Electronic parts 55 accommodated in a stick type chamber 54 are transported to a transfer portion 57 through an incline shoot 56. A stopper 58 is arranged at the transfer portion 57 to prevent the parts from dropping off from the shoot 56. Reference numeral 59 denotes a holder capable of moving horizontally in FIG. 15 with a slide guide 60 and driving device 64. The holder 59 moves to a position II shown by the dotted line in FIG. 15 while rollers 61 of the holder 59 move on the incline surface of a triangle cam member 62 and the holder 59 rotates around a fulcrum 63 to align the holder 59 with the shoot 56. At the same time, the stopper 58 is opened to transport the lowest one of the part 55 to the holder 59. Thereafter, the holder 59 moves to a position I shown by the solid line in FIG. 15 by the driving device 64 to supply one of the parts 55 to an electronic parts mounting machine. When the holder 59 starts to move from the position II to the position I, the stopper 58 is closed to prevent the parts 55 from dropping off from the shoot 56.

In addition to the above-described embodiments, various modifications can be made. In the above embodiment, the reading/writing means 9 is provided in the parts take-out position (A) of the parts supply section 5 and the waiting position of each parts supply base 8, but a plurality of reading means may be provided above the upper portion of the waiting position of the parts supply base 8 in correspondence with respective parts cassette 10 which are to be mounted on the parts supply base 8. Thus, the reading/writing means 9 is capable of performing a reading operation without moving the parts supply base 8.

In the above embodiment, the characteristics of the part are read in inspecting the parts cassette 10 when the parts cassette 10 is mounted on the parts mounting apparatus 1, and the storing section 26 stores the data thus read, and the data thus stored is compared with measured characteristic value by reading out the reference value of the characteristic of the part from the storing section 26. But it is possible that the storing section 26 does not store the parts characteristic, but the reference value may be read out from the storing section of the parts cassette 10 in measuring the part.

Although the present invention has been fully described in connection with the preferred embodiments thereof with reference to the accompanying drawings, it is apparent to those skilled in the art. Such changes and modifications are to be understood as included within the scope of the present invention as defined by the appended claims unless they depart therefrom.

What is claimed is:

1. An electronic parts mounting method for an electronic parts mounting apparatus which is supplied with electronic parts by a detachable electronic parts supply device attached to said electronic parts mounting apparatus, said detachable electronic parts supply device including a main body and a reel of electronic parts rotatably mounted to said main body, said method comprising:

- a first step, performed by a reading device of said electronic parts mounting apparatus, of reading data stored in a memory fixed to said main body of said detachable electronic parts supply device, said data denoting a part type and a reference characteristic value of each of said electronic parts of said reel;
- a second step, performed by a measuring device of said electronic parts mounting apparatus, of measuring a characteristic of at least one of said electronic parts extracted from said detachable electronic parts supply device;
- a third step, performed by said electronic parts mounting apparatus, of determining an acceptability of said at least one of said electronic parts by comparing said reference characteristic value read in said first step with said characteristic measured in said second step; and
- a fourth step, performed by said electronic parts mounting apparatus, of mounting said at least one of said electronic parts when said at least one of said electronic parts is determined to be acceptable in said third step.

2. An electronic parts mounting method for an electronic parts mounting apparatus which is supplied with electronic parts by a detachable electronic parts supply device attached to said electronic parts mounting apparatus, said detachable electronic parts supply device including a main body and a reel of electronic parts rotatably mounted to said main body, said method comprising:

- a first step, performed by a reading device of said electronic parts mounting apparatus, of reading first data stored in a first memory fixed to said main body of said detachable electronic parts supply device, said first data distinguishing a part type of each of said electronic parts of said reel;
- a second step, performed by said electronic parts mounting apparatus, of reading second data stored in a second memory according to said first data read in said first step, said second data denoting a mounting condition and a reference characteristic value of each of said electronic parts of said reel;
- a third step, performed by a measuring device of said electronic parts mounting apparatus, of measuring a characteristic of at least one of said electronic parts extracted from said detachable electronic parts supply device;
- a fourth step, performed by said electronic parts mounting apparatus, of determining an acceptability of said at least one of said electronic parts by comparing said reference characteristic value read in said second step with said characteristic measured in said third step; and
- a fifth step, performed by said electronic parts mounting apparatus, of mounting said at least one of said electronic parts according to said mounting condition read in said second step when said at least one of said electronic parts is determined to be acceptable in said fourth step.

3. An electronic parts mounting method for an electronic parts mounting apparatus which is supplied with electronic parts by a detachable electronic parts supply device, said detachable electronic parts supply device including a main body and a parts unit containing a plurality of electronic parts mounted to said main body, said method comprising:

- a first step of reading a distinguishing mark provided on said parts unit and reading prestored data from a first memory according to said distinguishing mark, said data denoting a mounting condition of said plurality of electronic parts contained in said parts unit;
- a second step of storing said data in a second memory fixed to said main body of said detachable electronic parts supply device;
- a third step of attaching said detachable electronic parts supply device to said electronic parts mounting apparatus;
- a fourth step, performed by said electronic parts mounting apparatus, of reading said data stored in said second memory fixed to main body of said detachable electronic parts supply device; and
- a fifth step, performed by said electronic parts mounting apparatus, of mounting at least one of said electronic parts according to said mounting condition of said data read in said fourth step.

4. An electronic parts mounting method for an electronic parts mounting apparatus which is supplied with electronic parts by a detachable electronic parts supply device, said detachable electronic parts supply device including a main body and a parts unit containing a plurality of electronic parts mounted to said main body, said method comprising:

- a first step of reading a distinguishing mark provided on said parts unit and reading prestored data from a first memory according to said distinguishing mark, said data denoting a reference characteristic value of said plurality of electronic parts contained in said parts unit;
- a second step of storing said data in a memory fixed to said main body of said detachable electronic parts supply device;
- a third step of attaching said detachable electronic parts supply device to said electronic parts mounting apparatus;
- a fourth step, performed by a reading device of said electronic parts mounting apparatus, of reading said data stored in said memory fixed to said main body of said detachable electronic parts supply device;
- a fifth step, performed by a measuring device of said electronic parts mounting apparatus, of measuring a characteristic of at least one of said electronic parts which has been extracted from said detachable electronic parts supply device;
- a sixth step, performed by said electronic parts mounting apparatus, of determining an acceptability of said at least one of said electronic parts by comparing said reference characteristic value read in said first step with said characteristic measured in said fifth step; and
- a seventh step, performed by said electronic parts mounting apparatus, of mounting said at least one of said electronic parts when said one of said electronic parts is determined to be acceptable in said sixth step.

5. An electronic parts mounting method for an electronic parts mounting apparatus which is supplied with electronic parts by a plurality of detachable electronic parts supply device, said detachable electronic parts supply devices each including a main body and a parts unit containing a plurality of electronic parts mounted to said main body, said method comprising:

- a first step of reading a distinguishing mark provided on said parts unit of each of said detachable electronic parts supply devices and reading prestored data from a first memory according to said distinguishing mark, said data denoting a type of said plurality of electronic parts contained in said parts unit of each of said detachable electronic parts supply devices;
- a second step of storing said data in a second memory fixed to said main body of each of said detachable electronic parts supply devices;
- a third step of attaching said detachable electronic parts supply devices to said electronic parts mounting apparatus;
- a fourth step, performed by said electronic parts mounting apparatus, of reading said data stored in said second memory fixed to main body of each of said detachable electronic parts supply devices and determining a relation between said type of said electronic parts and a corresponding position of each of said detachable electronic parts supply devices;
- a fifth step, performed by said electronic parts mounting apparatus, of reading third data from a third memory according to said second data read in said fourth step, said third data denoting a mounting condition of each respective type of electronic parts; and
- a sixth step, performed by said electronic parts mounting apparatus, of mounting at least one of said electronic parts according to said mounting condition of said third data read in said fifth step.

6. An electronic parts mounting method for an electronic parts mounting apparatus which is supplied with electronic parts by a plurality of detachable electronic parts supply devices attached to said electronic parts mounting apparatus, said detachable electronic parts supply devices each including a main body and a parts unit containing a plurality of electronic parts mounted to said main body, said method comprising:

- a first step, performed by a reading device of said electronic parts mounting apparatus, of electrically reading prestored first data directly from a first IC memory fixed to said main body of each of said detachable electronic parts supply devices, said first data denoting a type of said electronic parts of said respective parts units;
- a second step, performed by said electronic parts mounting apparatus, of determining a relation between said type of said electronic parts and a corresponding position of each of said detachable electronic parts supply devices;
- a third step, performed by said electronic parts mounting apparatus, of reading second data from a second memory according to said first data read in said first step, said second data denoting a mounting condition of each respective type of said electronic parts; and
- a fourth step, performed by said electronic parts mounting apparatus, of mounting at least one of said electronic parts according to said mounting condition of said second data read in said third step.

7. An electronic parts mounting method for an electronic parts mounting apparatus which is supplied with electronic parts by a plurality of detachable electronic parts supply device, said detachable electronic parts supply devices each including a main body and a parts unit containing a plurality of electronic parts mounted to said main body, said method comprising:

- a first step of reading a distinguishing mark provided on said parts unit of each of said plurality of detachable electronic parts supply devices, and reading prestored data from a first memory according to each said distinguishing mark, said data denoting a mounting condition of said plurality of electronic parts contained in said parts unit of each of said plurality of detachable electronic parts supply devices;
- a second step of storing said data in a second memory fixed to said main body of each of said detachable electronic parts supply device;
- a third step of attaching said detachable electronic parts supply devices to said electronic parts mounting apparatus;
- a fourth step, performed by said electronic parts mounting apparatus, of reading said data stored in second memory fixed to said main body of each of said detachable electronic parts supply devices and determining a relation between said type of electronic parts and a corresponding position of each of said detachable electronic parts supply devices; and
- a fifth step, performed by said electronic parts mounting apparatus, of mounting at least one of said electronic parts according to said mounting condition of said data read in said fourth step.

8. An electronic parts mounting method for an electronic parts mounting apparatus which is supplied with electronic parts by a detachable electronic parts supply device attached to said electronic parts mounting apparatus, said detachable electronic parts supply device including a main body and a parts unit containing a plurality of electronic parts mounted to said main body, said method comprising:

- a first step, performed by a reading device of said electronic parts mounting apparatus, of electrically reading prestored first data directly from a first IC memory fixed to said main body of said detachable electronic parts supply device, said first data distinguishing a part type of each of said electronic parts of said parts units
- a second step, performed by said electronic parts mounting apparatus, of reading second data stored in a second memory according to said first data read in said first step, said second data denoting a mounting condition of said electronic parts of said parts unit; and
- a third step, performed by said electronic parts mounting apparatus, of mounting said at least one of said electronic parts according to said mounting condition read in said second step.

* * * * *